March 19, 1963 B. CORNELISON 3,082,131

VERSATILE TRANSISTOR STRUCTURE

Filed Jan. 16, 1959

INVENTOR

Boyd Cornelison

BY Stevens, Davis, Miller & Mosher

ATTORNEYS

United States Patent Office 3,082,131
Patented Mar. 19, 1963

3,082,131

VERSATILE TRANSISTOR STRUCTURE

Boyd Cornelison, Dallas, Tex., assignor to Texas Instruments Incorporated, Dallas, Tex., a corporation of Delaware Filed Jan. 16, 1959, Ser. No. 787,256
2 Claims. (Cl. 148—33)

This invention relates to transistors, and more particularly relates to a method of making a novel transistor structure which can be connected in any one or more of several configurations. The resultant transistor structures are produced by a special combination of double-doping and grown-diffused techniques. NPN, PNP, NPNP, PNPN, NPIN and PNIP configurations are provided as determined by which of the leads to the transistor structure (which may also be either NPINP or PNIPN) are used.

The use of transistors in modern electronic devices to perform many functions and under vastly varying conditions often requires transistors of several different configurations. For example, at one point a PNP transistor should be used, while in another place an NPN configuration would be more advantageous. It would be quite advantageous then if transistors having various bias requirements, Zener breakdown voltages and current gains ($\alpha$) could all be obtained from a single transistor device. The specific transistor configuration needed to satisfy given requirements at any instant could be obtained simply by connecting the transistor device in a particular manner. When it would be necessary to obtain a different transistor configuration, the transistor device would be connected into the circuit in a different way. Moreover, in laboratory work it would certainly be desirable to have on hand transistors requiring different bias voltages and exhibiting different Zener breakdown voltages and current gains ($\alpha$). At the same time, it would be inconvenient to maintain a supply of a wide variety of transistors having different characteristics so that some transistors would always be available to satisfy the varying requirements encountered in research, development or production work.

Despite these advantages, however, probably the greatest advantage of the device of the present invention arises from its ability to function as two complete transistors, such as, for example, in direct coupled complementary circuits; i.e., NPN device directly coupled to a PNP device.

It is, therefore, the principal object of the present invention to provide a unique transistor structure capable of a wide variety of uses.

It is another object of the present invention to provide a general transistor structure which may be reduced to any one of several different specific transistor configurations, each having slightly different characteristics, simply by connecting leads of the general transistor in different ways in the circuit.

It is a further object of the present invention to provide a method for manufacturing a transistor structure of the type described which is uniquely adapted to the manufacture of such a transistor. The method includes combinations of double-doping and grown-diffused techniques.

Other and further objects, advantages and characteristic features of the present invention will become readily apparent upon consideration of the following detailed description of preferred embodiments of the invention when taken in conjunction with the appended drawings, in which:

FIGURE 5 is a graph of excess donor or acceptor concentration as a function of the length of the semiconductor crystal, and has specific reference to the embodiment shown in FIGURES 2 and 4.

Figure 1:
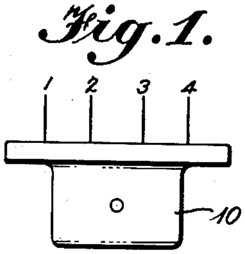
FIGURE 1 is a side view of a transistor constructed in accordance with the principles of the present invention.

Referring now to the drawings, there will be described a method for manufacturing the versatile transistor structure of the present invention.

FIGURE 1 shows a transistor 10 having leads designated as 1, 2, 3 and 4. The transistor may take the configuration shown in either FIGURE 2 or FIGURE 3, the restriction being that for the configuration of FIGURE 2 germanium semiconductor material is used, whereas in the transistor configuration of FIGURE 3 silicon is the semiconductor material. The reason for this is that for the specific doping materials used the diffusion rates are such that the NPINP configuration of FIGURE 2 can only be produced in silicon, while the PNIPN configuration of FIGURE 3 can only be made in germanium. For the purposes of illustration, the method of manufacturing the germanium transistor of FIGURE 2 will be described in detail. It should be understood, however, that the same process may equally well be used in the manufacture of the silicon transistor of FIGURE 3 with the obvious modification of using P-dope where N-dope had been used in the germanium transistor, and vice versa.

Figure 2:
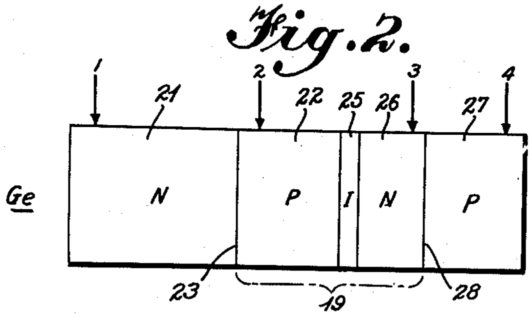
FIGURE 2 illustrates schematically an NPINP germanium transistor produced according to one embodiment of the present invention.
Figure 4:
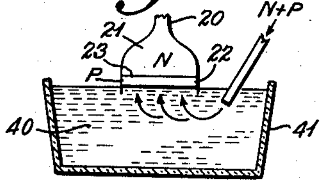
FIGURE 4 illustrates a step in the process for manufacturing the transistor shown in FIGURE 2.
Figure 4:
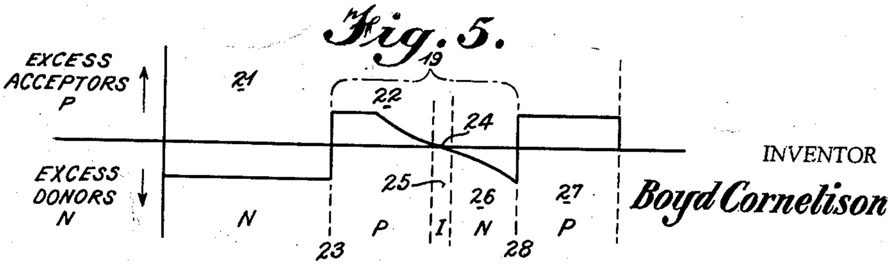

In fabricating the NPINP transistor of FIGURE 2, a crystal of germanium 20 (see FIGURE 4) is produced as follows: First, conventional double-doping techniques are used for growing an NP junction in the crystal. As is shown in FIGURE 4, N-dope (which may be such material as arsenic or antimony) is applied to a bath of molten germanium 40 contained in crucible 41, and a crystal 20 is drawn out of the bath to grow an N-type region 21. Next, P-dope (which may consist of boron, aluminum, indium or gallium) is added to the melt 40. The P-dope is present in a greater quantity than the N-dope so that there is an excess of acceptors over donors, and as the crystal 20 is drawn from the bath 40, a region 19 of P-type material is grown (see FIGURE 5). As a result, a "double-dope" barrier, or junction, 23 is formed between the N-region 21 and the P-region 19.

After the P-region 19 has been formed, a grown-diffused technique is employed to produce the remaining junctions. As is shown in FIGURE 4, both N-dope and P-dope are simultaneously inserted into the melt 40, the N and P-dopes diffusing into the P-region 19 of the crystal 20 to produce the transistor structure shown in FIGURE 2. For the specific materials used in this embodiment, the rate of diffusion of the N-dope is much greater than that of the P-dope. Hence, the N-dope is able to diffuse farther into the region 19 and reach a distance nearer the barrier 23 than is the P-dope which diffuses very little.

After the P and N-dopes are added to the molten germanium, the N-dope diffuses into the already grown region 19 in such a way that the concentration of excess acceptors over donors is gradually reduced as a function crystal length (which may be seen from the negative slope of the portion of the graph of FIGURE 5 near the center of region 19) until a point 24 is reached where an equal amount of donors and acceptors are present. If the slope of excess impurity concentration versus crystal length is sufficiently flat, for all practical purposes a thin region, or zone, exists in which practically equal amounts of donors and acceptors are present. As a result a thin region of nearly wholly compensated and thus extremely high resistivity semiconductor material will be produced. Such a compensated region is quite similar in many of its properties to semiconductor material having absolutely no impurities, i.e. intrinsic material. In fact, such compensated regions are usually, although incorrectly, called I or intrinsic regions. In the transistor structure of the present invention, the excess acceptor concentration is gradually diminished by the diffused N-dope until a high resistivity I region 25 of essentially compensated germanium is formed in the previously grown region 19.

On the other hand, if the slope of excess impurity concentration versus crystal length is great enough, the width of the intrinsic region 25 will be so narrow that for all practical purposes it is non-existent, and the final transistor configuration becomes NPNP rather than NPINP.

The N-type impurities which diffuse from the molten germanium into the region 19 of the solid crystal, of course, are much more concentrated in the end of the crystal near the diffusion source, i.e., melt. Thus, an N-type region 26 is formed in the crystal. As a result of the diffusion of N-type impurities from the melt into the already grown P-type region 19, the P-type region has been reduced in size to the region 22, and a diffused N-type region 26 has been formed with perhaps an I region 25 formed therebetween under certain conditions as described above.

During the time the above described diffusion process is taking place, crystal growth is, of course, continuing. Because of the relative quantities of N and the P-type dopes added to the melt as described above, the material added to the crystal from the melt through the growth process is of P-type and the junction 28 is produced. Thus, it should be noted that the barriers, or junctions, between the regions 22, 26 and 27 are of the grown-diffused variety as opposed to the double-dope junction 23 between N-zone 21 and P-zone 22. The crystal 20 is then cut, and the NPINP configuration shown in FIGURE 2 results.

Figure 3:
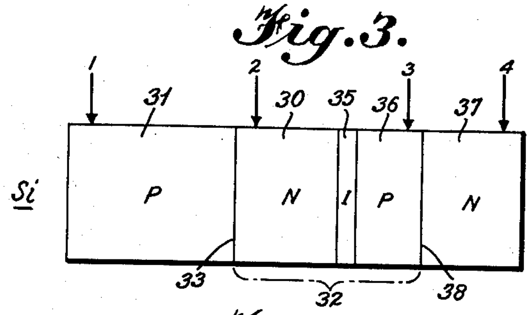
FIGURE 3 illustrates schematically a PNIPN silicon transistor produced according to a second embodiment of the present invention.

If it is desired to grow a PNIPN transistor structure, the identical procedure is followed except for the following modifications: Silicon is used in place of germanium, and a PN crystal having a P-region 31, an N-region 32 and junction 33 is formed according to conventional double-dope techniques. Then after the N-impurities are introduced into the melt and an N-region 32 is grown, N and P-dopes are introduced simultaneously into the melt, the diffusion rates of these dopes in silicon being such that the P-dope diffuses faster and farther into the silicon than the N-dope. As a result, intrinsic region 35, P-region 36, and N-region 37 are formed in the silicon crystal, leaving only the portion 30 or region 32 of its original N-type, and the PNIPN transistor shown in FIGURE 3 is produced.

The device of the present invention may be used in a great number of circuit configurations depending upon the connection of the four leads into the circuit. For example, the device may be used as an avalanche diode or thyratron-type switch by the connection of the leads 1 and 4 into the circuit. Connection of either or both of leads 2 and 3 will provide a variable firing potential. Further, the device may be used as a single NPN transistor using lead 1 as the emitter, lead 2 as the base, and lead 3 as the collector connection. Further, the device may be operated as a PNP transistor using lead 4 as the emitter, lead 3 as the base, and lead 2 as the collector. Still further, the device may function as an NPNP hook collector transistor or as a PNPN hook collector transistor depending upon the connection of the four leads into the circuit. In addition, the device may be used as two transistors in a direct-coupled complementary circuit by connecting region 21 as the emitter of the NPN section and region 26 as the collector and by using region 22 as the emitter of the PNP section with region 27 as the collector. Other unique circuit connections and uses of the device in the present invention will occur to those skilled in the art.

Although the present invention has been shown and described with reference to particular embodiments, nevertheless various changes and modifications to those skilled in the art are deemed to be within the spirit, scope and contemplation of the invention.

What is claimed is:

1. A transistor device comprising a semiconductor crystal having a zone of one conductivity type, an adjacent zone of opposite conductivity type, a second zone of said one conductivity type adjacent said adjacent zone, and a second zone of said opposite conductivity type adjacent said second zone of said one conductivity type, the changes in conductivity type between said first zone of one conductivity type and said adjacent zone and between said second zone of one conductivity type and said second zone of opposite conductivity type being abrupt and the change in conductivity type between said first zone of opposite conductivity type and said second zone of one conductivity type being relatively gradual.

2. A transistor device comprising a semiconductor crystal having a zone of one conductivity type, an adjacent zone of opposite conductvity type, a zone of essentially compensated semiconductor material adjacent said zone of opposite conductivity type, a zone of said one conductivity type adjacent said zone of essentially compensated semiconductor material, and a zone of said opposite conductivity type adjacent said second-named zone of said one conductivity type, the junctions between said zones of one conductivity type and said zones of opposite conductivity type being abrupt.

References Cited in the file of this patent

UNITED STATES PATENTS

| | | |
|---|---|---|
| 2,597,028 | Pfann | May 20, 1952 |
| 2,623,105 | Shockley et al. | Dec. 23, 1952 |
| 2,767,358 | Early | Oct. 16, 1956 |
| 2,819,990 | Fuller et al. | Jan. 14, 1958 |
| 2,822,308 | Hall | Feb. 4, 1958 |
| 2,843,516 | Herlet | July 15, 1958 |
| 2,899,343 | Statz | Aug. 11, 1959 |
| 2,950,219 | Pohl | Aug. 23, 1960 |

FOREIGN PATENTS

| | | |
|---|---|---|
| 779,383 | Great Britain | July 17, 1957 |